US012782415B2

(12) United States Patent
Bertino et al.

(10) Patent No.: US 12,782,415 B2
(45) Date of Patent: Nov. 3, 2026

(54) ELECTRONIC CIRCUIT TO VERIFY THE STATE OF INTEGRITY OF A DIODE

(71) Applicant: ELDOR CORPORATION S.P.A., Orsenigo (IT)

(72) Inventors: Francesco Bertino, Orsenigo (IT); Pasquale Forte, Orsenigo (IT); Paolo Lisanti, Orsenigo (IT)

(73) Assignee: BORGWARNER ORSENIGO S.R.L., Orsenigo (IT)

( * ) Notice: Subject to any disclaimer, the term of this patent is extended or adjusted under 35 U.S.C. 154(b) by 84 days.

(21) Appl. No.: 18/861,071

(22) PCT Filed: Apr. 27, 2023

(86) PCT No.: PCT/IB2023/054343

§ 371 (c)(1),
(2) Date: Oct. 28, 2024

(87) PCT Pub. No.: WO2023/209620

PCT Pub. Date: Nov. 2, 2023

(65) Prior Publication Data

US 2025/0290969 A1 Sep. 18, 2025

(30) Foreign Application Priority Data

Apr. 29, 2022 (IT) ........................ 102022000008609

(51) Int. Cl.
*G01R 31/26* (2020.01)
*G01R 15/04* (2006.01)
(Continued)

(52) U.S. Cl.
CPC ......... *G01R 31/2632* (2013.01); *G01R 15/04* (2013.01); *G01R 19/0038* (2013.01); *G01R 31/52* (2020.01); *H02H 7/22* (2013.01)

(58) Field of Classification Search
CPC .. H02J 1/108; H02H 9/02; H02H 7/22; H10D 8/60; G01R 31/2632; G01R 15/04;
(Continued)

(56) References Cited

U.S. PATENT DOCUMENTS 4,346,347 A * 8/1982 Kamata .............. G01R 31/2632 340/645
2006/0108875 A1* 5/2006 Grundmann ........... G01R 31/40 307/70
2016/0274195 A1* 9/2016 Collins .................. G01R 31/40

FOREIGN PATENT DOCUMENTS

DE 102020132666 B3 3/2022
EP 1659415 A2 * 5/2006 ........... G01R 31/129
JP 2012-185055 A 9/2012

OTHER PUBLICATIONS

International Search Report and Written Opinion, mailed Jun. 15, 2023, from PCT App. No. PCT/IB2023/054343, 13 pages.

* cited by examiner

*Primary Examiner* — Jue Zhang
*Assistant Examiner* — Nicolas Bellido
(74) *Attorney, Agent, or Firm* — Workman Nydegger

(57) ABSTRACT

It is disclosed an electronic circuit to verify the state of integrity of a diode. The electronic circuit comprises a voltage comparator and a voltage divider. The electronic circuit is configured to generate a monitoring signal having a first value indicative of a state of correct operation of the diode and having a second value indicative of a state of short circuit of the diode.

20 Claims, 1 Drawing Sheet

(51) Int. Cl.
*G01R 19/00* (2006.01)
*G01R 31/52* (2020.01)
*H02H 7/22* (2006.01)

(58) Field of Classification Search
CPC .. G01R 19/0038; G01R 31/52; G01R 31/006; G01R 31/40; G01R 31/2827
See application file for complete search history.

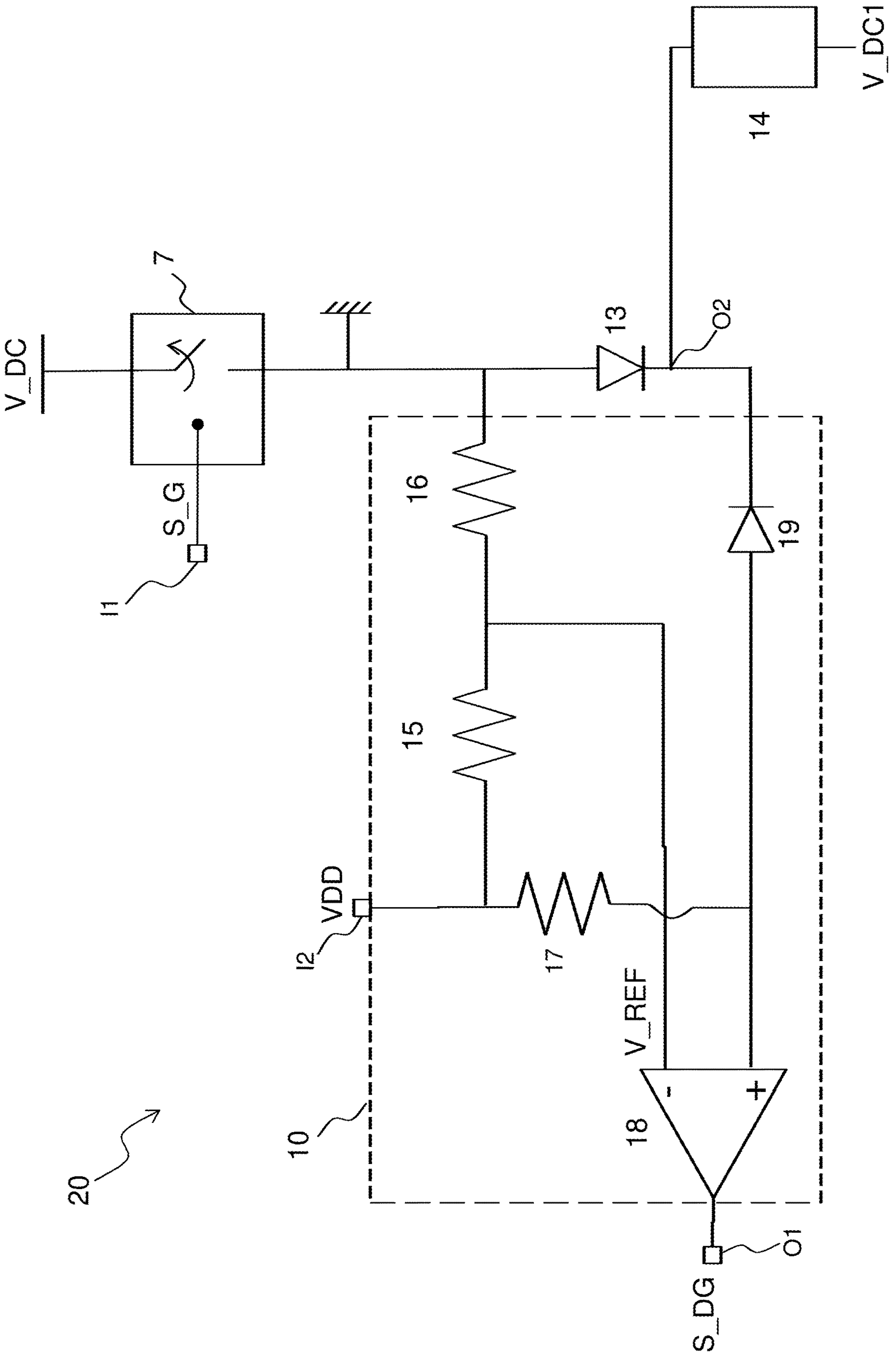
V_DC
7
S_G
I1
13
O2
14
V_DC1
16
15
19
VDD
I2
17
V_REF
18
10
20
O1
S_DG

ELECTRONIC CIRCUIT TO VERIFY THE STATE OF INTEGRITY OF A DIODE

BACKGROUND

Technical Field

The present disclosure generally relates to the electronics field.

More particularly, the present disclosure concerns an electronic circuit to verify the state of integrity of a diode.

Description of the Related Art

It is known to use protection switches with the function of disconnecting a power supply voltage for safety reasons is known.

For example, in the automotive field it is important to disconnect a power supply voltage of a battery charger mounted on board of an electric vehicle, in the case where faults occur in the components of the battery charger supplied by said power supply voltage.

It is also known to use protection diodes having the function of protecting a power supply source, in the case where a reversal of the power supply current occurs such to be directed towards the power supply source.

It is therefore important to verify the state of integrity of the protection diode, in order to maintain efficient protection against reversals of the power supply current.

BRIEF SUMMARY

The present disclosure concerns an electronic circuit to verify the state of integrity of a diode as defined in the appended claim 1 and by the embodiments thereof described in the appended dependent claims.

The Applicant has perceived that the electronic circuit in accordance with the present disclosure can detect the state of short circuit of a diode of a power supply source, thereby reducing the risk of damaging the power supply source.

The basic idea is to force a reverse polarization of the diode and to monitor the voltage drop at the ends of the protection diode, in order to verify if it has a switching from a value greater than zero to a value substantially equal to zero, wherein the latter case occurs when the protection diode is in the state of short circuit.

One embodiment of the present disclosure is a power supply electronic system, wherein the power supply electronic system is defined in the appended claim 7 and by the embodiments thereof described in the appended dependent claims 8 and 9.

BRIEF DESCRIPTION OF THE SEVERAL VIEWS OF THE DRAWINGS

Further features and advantages of the disclosure will become more apparent from the description which follows of an embodiment and the variants thereof, provided by way of example with reference to the appended drawings, in which:

FIG. 1 shows a block diagram of a power supply electronic system comprising an electronic circuit to verify the state of integrity of a diode according to an embodiment of the disclosure.

DETAILED DESCRIPTION

It should be observed that, in the following description, identical or analogous blocks, components or modules are indicated in the FIGURES with the same numerical references, even if they are shown in different embodiments of the disclosure.

Referring to FIG. 1, it shows a power supply electronic system 20 according to an embodiment of the disclosure.

The power supply electronic system 20 is used to supply an electric load 14, such as for example to supply a battery charger mounted on board of an electric vehicle.

The electronic system 20 comprises a protection switch 7, a protection diode 13 and an electronic circuit 10 to verify the state of integrity of the protection diode 13.

The protection diode 13 is interposed between a power supply voltage V_DC and the electric load 14; for example, the protection diode 13 is connected in series to a power supply line supplied by the power supply voltage V_DC.

Therefore the assembly of the switch 7, diode 13 and load 14 constitute the main electronic circuit operating at the power supply voltage V_DC.

To verify the state of integrity of the protection diode 13 means to verify whether the protection diode 13 (in particular a diode used in series with a power supply line) is able to operate correctly so as to generate a defined voltage drop at the ends thereof (typically comprised between 0.2 Volts and 2 Volts) in the case of forward polarization and so as to generate a reverse voltage drop (equal to a monitoring voltage VDD of the electronic circuit 10) in the case of reverse polarization.

In particular, the electronic circuit 10 has the function of verifying whether the protection diode 13 is in a state of short circuit.

For the purpose of explaining the disclosure, a protection diode has been considered, but the disclosure is also applicable to diodes with different functionality.

The protection switch 7 comprises a first terminal adapted to receive the power supply voltage V_DC of any value for supplying the electric load 14, it comprises a second terminal connected to a ground reference voltage and it comprises a control terminal 11 adapted to receive a control signal S_G driving the high-voltage switch 7 to switch between an open position and a closed position, as a function of the value of the control signal S_G itself.

The control signal S_G is generated for example by a processing unit.

The protection switch 7 is for example an IGBT or MOSFET transistor.

The electronic circuit 10 is connected in parallel to the protection diode 13 and it has the function of verifying the integrity of the protection diode 13, using the monitoring voltage VDD which is independent (i.e. different from) on the power supply voltage V_DC of the main electronic circuit.

The electronic circuit 10 comprises an input terminal 12 adapted to receive the monitoring voltage VDD and it comprises a first output terminal O1 adapted to generate a monitoring signal S_DG representative of a state of operation of the protection diode 13, i.e. if it is in a state of correct operation or if it is in a state of short circuit.

The electronic circuit 10 comprises the following components:

- a voltage comparator 18;
- a voltage divider comprising the series connection of a first resistor 15 and of a second resistor 16;
- a third resistor 17;
- a diode 19.

The electric and electronic components of the electronic driving circuit 10 are electrically connected as shown in FIG. 1.

In particular, the voltage divider comprises the first resistor 15 having a first terminal adapted to receive the monitoring voltage VDD and it comprises a second terminal connected to the second resistor.

The second resistor 16 comprises a first terminal connected to the second terminal of the first resistor 15 and it comprises a second terminal connected to the protection diode 13.

The protection diode 13 comprises an anode terminal connected to the second terminal of the second resistor 16 and comprises a cathode terminal connected to the diode 19 and to a terminal O2 of the load 14.

The voltage comparator 18 comprises a negative terminal connected to the common terminal between the first resistor 15 and the second resistor 16 and it comprises a positive terminal connected to the diode 19.

The voltage comparator 5 can also be realized with an operational amplifier.

The diode 19 is interposed between the positive terminal of the voltage comparator 18 and the protection diode 13.

In particular, the anode terminal of the diode 19 is connected to the positive terminal of the voltage comparator 18 and the cathode terminal is connected to the cathode terminal of the protection diode 13 and to a first terminal O2 of the load 14.

Furthermore, the second load terminal 14 is connected to a reference voltage V_DC1, which may be a ground or a power supply voltage having a value different from the power supply voltage V_DC.

The resistor 17 comprises a first terminal connected to the first terminal of the first resistor 15 (and thus adapted to receive the monitoring voltage VDD) and a second terminal connected to the positive terminal of the voltage comparator 18 (and thus connected to the anode terminal of the diode 19).

The voltage comparator 18 is configured to generate the monitoring signal S_DG having a first logic value (e.g., a high logic value) representative of a correct operation of the protection diode 13 and having a second logic value (e.g., a low logic value) representative of a state of short circuit of the protection diode 13.

During operation, a positive voltage is forced on the cathode terminal of the diode 13 by means of the path composed of the monitoring voltage VDD, resistor 17, diode 19, thus the voltage comparator 18 performs a comparison between the voltage drop at the ends of the protection diode 13 (except for the voltage drop at the ends of the diode 19) and a reference voltage V_REF equal to the partitioned voltage on the common terminal between the first resistor 15 and the second resistor 16.

In the case where the protection diode 13 is in a state of correct operation (i.e. it is not short-circuited), the protection diode 13 is in the state of reverse polarization in which a non-negligible voltage drop is present between the cathode terminal and the anode terminal of the protection diode 13, in particular equal to the monitoring voltage VDD: the voltage comparator 18 detects that the voltage value of its positive terminal is greater than the value of the reference voltage V_REF on its negative terminal and thus it generates the monitoring signal S_DG having a first logic value (e.g., a high logic value) representative of a correct operation of the protection diode 13.

In the case where the protection diode 13 is in a state of short circuit, the voltage drop between the cathode terminal and the anode terminal of the protection diode 13 is substantially zero: the voltage comparator 18 detects that the voltage value of its positive terminal is lower than the value of the reference voltage V_REF on its negative terminal and thus it generates the monitoring signal S_DG having a second logic value (e.g., a low logic value) representative of a short circuit of the protection diode 13.

The invention claimed is:

1. An electronic circuit to verify a state of integrity of a diode, the electronic circuit comprising:

a first terminal adapted to receive an anode voltage of the diode;

a second terminal adapted to receive a cathode voltage of the diode;

an input terminal adapted to receive a monitoring voltage;

an output terminal adapted to generate a monitoring signal representative of a state of operation of the diode;

a voltage divider configured to generate a partitioned voltage as a function of the monitoring voltage; and a voltage comparator configured to compare a voltage drop at ends of the diode with respect to a value of the partitioned voltage and to generate therefrom the monitoring signal;

wherein the voltage comparator is configured to:

detect that the voltage drop at the ends of the diode is greater than the partitioned voltage and generate therefrom the monitoring signal having a first value indicative of a state of correct operation of the diode; and detect that the voltage drop at the ends of the diode is less than the partitioned voltage and generate therefrom the monitoring signal having a second value indicative of a state of short circuit of the diode.

2. The electronic circuit according to claim 1, wherein:

in case of correct operation of the diode, the diode is in a reverse polarization state and the voltage drop at the ends thereof is equal to the monitoring voltage; and in case of short circuit of the diode, the voltage drop at the ends of the diode is substantially zero.

3. The electronic circuit according to claim 1, wherein the voltage divider comprises a series connection of a first resistor and of a second resistor, wherein the partitioned voltage is a common terminal between the first resistor and the second resistor.

4. The electronic circuit according to claim 3, wherein the voltage comparator comprises a negative terminal adapted to receive a reference voltage equal to the partitioned voltage and comprises a positive terminal adapted to receive the cathode voltage of the diode.

5. The electronic circuit according to claim 4, further comprising a resistor interposed between the input terminal and the positive terminal of the voltage comparator.

6. The electronic circuit according to claim 4, comprising a further diode interposed between the positive terminal of the voltage comparator and the cathode voltage of the diode.

7. The electronic circuit according to claim 2, wherein the voltage divider comprises a series connection of a first resistor and of a second resistor, wherein the partitioned voltage is a common terminal between the first resistor and the second resistor.

8. The electronic circuit according to claim 7, wherein the voltage comparator comprises a negative terminal adapted to receive a reference voltage equal to the partitioned voltage and comprises a positive terminal adapted to receive the cathode voltage of the diode.

9. The electronic circuit according to claim 8, further comprising a resistor interposed between the input terminal and the positive terminal of the voltage comparator.

10. The electronic circuit according to claim 2, wherein the voltage comparator comprises a negative terminal adapted to receive a reference voltage equal to the partitioned voltage and comprises a positive terminal adapted to receive the cathode voltage of the diode.

11. The electronic circuit according to claim 10, further comprising a resistor interposed between the input terminal and the positive terminal of the voltage comparator.

12. The electronic circuit according to claim 10, comprising a further diode interposed between the positive terminal of the voltage comparator and the cathode voltage of the diode.

13. The electronic circuit according to claim 1, wherein the voltage comparator comprises a negative terminal adapted to receive a reference voltage equal to the partitioned voltage and comprises a positive terminal adapted to receive the cathode voltage of the diode.

14. The electronic circuit according to claim 13, further comprising a resistor interposed between the input terminal and the positive terminal of the voltage comparator.

15. The electronic circuit according to claim 14, comprising a further diode interposed between the positive terminal of the voltage comparator and the cathode voltage of the diode.

16. The electronic circuit according to claim 13, comprising a further diode interposed between the positive terminal of the voltage comparator and the cathode voltage of the diode.

17. A power supply electronic system comprising:

an electronic circuit comprising:

a first terminal adapted to receive an anode voltage of a diode;

a second terminal adapted to receive a cathode voltage of the diode;

an input terminal adapted to receive a monitoring voltage;

an output terminal adapted to generate a monitoring signal representative of a state of operation of the diode;

a voltage divider configured to generate a partitioned voltage as a function of the monitoring voltage;

a voltage comparator configured to compare a voltage drop at ends of the diode with respect to a value of the partitioned voltage and to generate therefrom the monitoring signal;

wherein the voltage comparator is configured to:

detect that the voltage drop at the ends of the diode is greater than the partitioned voltage and generate therefrom the monitoring signal having a first value indicative of a state of correct operation of the diode; and detect that the voltage drop at the ends of the diode is less than the partitioned voltage and generate therefrom the monitoring signal having a second value indicative of a state of short circuit of the diode;

a further diode connected in parallel to the electronic circuit, the diode having a cathode terminal coupled to a positive terminal of the voltage comparator and having an anode terminal coupled to a negative terminal of the voltage comparator; and a switch interposed between a power supply voltage different from the monitoring voltage and the anode terminal of the diode, the switch being configured to switch between an open position and a closed position as a function of the value of a control signal.

18. The power supply electronic system according to claim 17, further comprising an electric load having a terminal connected to the cathode terminal of the diode, wherein the diode is interposed between the power supply voltage and the electric load.

19. The power supply electronic system according to claim 17, wherein the cathode terminal of the diode is coupled to the positive terminal of the comparator using the further diode and the anode terminal of the diode is coupled to the negative terminal of the comparator using a second resistor.

20. The power supply electronic system according to claim 18, wherein the cathode terminal of the diode is coupled to the positive terminal of the comparator using the further diode and the anode terminal of the diode is coupled to the negative terminal of the comparator using a second resistor.

* * * * *